US010009024B2

(12) United States Patent
Gan et al.

(10) Patent No.: US 10,009,024 B2
(45) Date of Patent: Jun. 26, 2018

(54) POWER CONVERSION DEVICE, DRIVING DEVICE AND DRIVING METHOD

(71) Applicant: Delta Electronics (Shanghai) Co., Ltd., Shanghai (CN)

(72) Inventors: Hong-Jian Gan, Shanghai (CN); Ming Wang, Shanghai (CN); Jian-Ping Ying, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 415 days.

(21) Appl. No.: 14/741,443

(22) Filed: Jun. 16, 2015

(65) Prior Publication Data
US 2015/0380931 A1    Dec. 31, 2015

(30) Foreign Application Priority Data

Jun. 25, 2014    (CN) .......................... 2014 1 0293230

(51) Int. Cl.
*H03K 17/691* (2006.01)
*H03K 17/082* (2006.01)
(Continued)

(52) U.S. Cl.
CPC ......... *H03K 17/691* (2013.01); *H03K 17/082* (2013.01); *H03K 17/18* (2013.01); *H03K 17/61* (2013.01); *H03K 2217/0081* (2013.01)

(58) Field of Classification Search
CPC .... H03K 17/691; H03K 17/18; H03K 17/082; H03K 17/605; H03K 17/61;
(Continued)

(56) References Cited

U.S. PATENT DOCUMENTS 5,596,466 A    1/1997    Ochi
6,385,059 B1    5/2002    Telefus et al.
(Continued)

FOREIGN PATENT DOCUMENTS

CN    101039068 A    9/2007
CN    103457449 A    12/2013
(Continued)

OTHER PUBLICATIONS

Jang, Sung-Roc, et al. "Comparative study of MOSFET and IGBT for high repetitive pulsed power modulators." IEEE Transactions on Plasma Science 40.10 (2012): 2561-2568.*

*Primary Examiner* — Ryan Johnson
(74) *Attorney, Agent, or Firm* — CKC & Partners Co., Ltd.

(57) ABSTRACT

A driving device includes a driving primary circuit, an isolating transforming circuit, and at least one driving secondary circuit. The isolating transforming circuit is coupled to the driving primary circuit. The at least one driving secondary circuit is coupled to the isolating transforming circuit. The driving primary circuit receives a control signal and a power signal. The driving primary circuit generates a driving pulse signal according to the control signal and generates a power pulse signal according to the power signal. The driving primary circuit transmits the driving pulse signal and the power pulse signal to the at least one driving secondary circuit through the isolating transforming circuit. The at least one driving secondary circuit receives the driving pulse signal so as to generate a driving signal, and the at least one driving secondary circuit drives a power semiconductor switch unit according to the driving signal.

25 Claims, 6 Drawing Sheets

(51) Int. Cl.
*H03K 17/18* (2006.01)
*H03K 17/61* (2006.01)

(58) Field of Classification Search
CPC ........ H03K 5/1252; H03K 2217/0081; H02M 1/088; H02M 1/08; H02M 1/32
See application file for complete search history.

(56) References Cited

U.S. PATENT DOCUMENTS

| | | | |
|---|---|---|---|
| 7,336,118 B2* | 2/2008 | Ishikawa | H02M 1/08 327/432 |
| 7,440,300 B2 | 10/2008 | Konishi et al. | |
| 2013/0082762 A1 | 4/2013 | Gan et al. | |
| 2014/0049295 A1 | 2/2014 | Gan et al. | |
| 2014/0055172 A1* | 2/2014 | Wang | H03K 17/16 327/109 |
| 2015/0137871 A1* | 5/2015 | Takano | H03K 17/687 327/389 |

FOREIGN PATENT DOCUMENTS

| | | |
|---|---|---|
| CN | 103636126 A | 3/2014 |
| EP | 2393194 A1 | 12/2011 |
| TW | 201244352 A | 11/2012 |
| TW | 201315074 A1 | 4/2013 |
| WO | 2012/145475 A1 | 10/2012 |
| WO | 2013/174528 A2 | 11/2013 |

* cited by examiner

POWER CONVERSION DEVICE, DRIVING DEVICE AND DRIVING METHOD

RELATED APPLICATIONS

This application claims priority to Chinese Application Serial Number 201410293230.1, filed Jun. 25, 2014, which is herein incorporated by reference.

BACKGROUND

Field of Invention

The present invention relates to an electronic device and a control method. More particularly, the present invention relates to a power conversion device, a driving device and a driving method.

Description of Related Art

With the advancement of science and technology, the techniques used by the electronic power industry are maturing; hence, power supply devices are widely applied in various electronic devices. Reliability is a basic requirement for such electronic power devices. A reliable electronic power device can stably operate under normal operating conditions, and can effectively protect itself when malfunctioning, so that the electronic power device will not be damaged.

In applications involving high-power electrical devices (for example, industrial computers, servers, power equipment, and so on), product reliability is extremely high. Mean time between failures (MTBF) is commonly used as a standard for measuring reliability. If the MTBF of an electrical device is large, the reliability of the electrical device is high.

In present-day power supplies of electronic devices, optical fibers are typically used to transmit control signals to high-voltage sides of the output ends of such power supplies so as to control power switching elements in the high-voltage sides. Compared with using electrical connections, performing transmission utilizing optical fibers allows for electrical isolation to be realized between high-voltage sides and low-voltage sides of transforming modules and between each power switching element of the high-voltage sides so as to avoid electrical noise interference therebetween.

However, compared with other electrical devices in a system, in general, the MTBF of an optical fiber transceiver is extremely low, such that optical fibers have become stumbling blocks with respect to enhancing reliability of a system.

Moreover, since each power switch needs to be isolated from the low voltage side and other power switch elements on the same high-voltage side, each power switch element needs a set of optical fibers for transmitting driving signals. Hence, using optical fibers to realize isolation will substantially increase the cost and structural complexity of a system.

In addition, since there is a significant delay time for transmitting signals by optical fibers, the consistency (or synchronicity) in transmitting the same signals is poor. When high consistency is demanded, the reliability of power switch elements will be affected.

Transmitting driving signals using magnetic isolation instead of optical isolation for achieving electrical isolation can enhance the reliability, reduce the cost, and simplify the structure of a system, as well as decrease delay time, and increase the consistency of signals so as to effectively solve the problems caused by using optical isolation.

Transmitting driving signals to switching units connected in series by using magnetic isolation has been used in series driving circuits for driving half-controlled power switch elements. For example, the driving signals of a low-voltage side are transmitted through transformers connected in series so as to transmit triggering pulses with driving ability to a high-voltage side for driving half-controlled power switch elements connected in series. A conventional half-controlled power switch element is, for example, a silicon controlled rectifier (SCR).

Due to the properties of half-controlled power switch elements, the requirements of driving signals for an SCR are that (1) only an extremely narrow pulse is necessary to trigger and turn on an SCR, and a turn-off signal is unnecessary since a half-controlled power switch element cannot be turned off by a driving signal; and (2) since the pulse of a driving signal for a half-controlled power switch elements is narrow, a driving signal and driving power thereof can be transmitted through a pulse transformer simultaneously.

Furthermore, there are many differences between the requirements of driving signals for full-controlled power switch elements and the requirements of driving signals for half-controlled power switch elements. For example, turning on and off full-controlled power switch elements are both performed using driving signals. Moreover, a stable high-voltage level is necessary for turning on full-controlled power switch elements, and a stable low-voltage level is necessary for turning off full-controlled power switch elements. As another example, the pulse width of driving signals for full-controlled power switch elements is wider than the pulse width of driving signals for half-controlled power switch elements (for example, SCR).

Hence, transmitting driving signals of half-controlled power switch elements (for example, an SCR) through magnetic isolation cannot be used in full-controlled power switch elements.

Some electrical devices do not have malfunction detectors; hence, if power electronic devices are malfunctioning, these power electronics devices cannot effectively detect the malfunction, so that these power electronic devices cannot warn users and take any effective protective measures.

Moreover, although some power electronic devices have malfunction detectors, these power electronic devices transmit malfunction signals through optical isolation elements, such that manufacturing costs are increased and reliability is decreased.

In view of the foregoing, problems and disadvantages are associated with existing products that require further improvement. However, those skilled in the art have yet to find a solution.

SUMMARY

The following summary presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure provides a driving device. The driving device includes a driving primary circuit, an isolating transforming circuit, and at least one driving secondary circuit. The driving primary circuit is configured to receive a control signal and a power signal, wherein the driving primary circuit is configured to generate a driving pulse signal based on the control signal, and generate a power pulse signal based on the power signal. The isolating transforming circuit is configured to be coupled to the driving primary circuit, wherein the isolating transforming circuit comprises a first isolating transforming unit and a second isolating transforming unit, wherein the first isolating transforming unit comprises one of a plurality of first pulse transformers, a second pulse transformer, and a plurality of third pulse transformers, and the second isolating transforming unit comprises one of a plurality of fourth pulse transformers, a fifth pulse transformer, and a plurality of sixth pulse transformers. One of the first pulse transformers includes a primary winding and a secondary winding, and the primary or winding is electrically coupled to the driving primary circuit, wherein the primary windings are sequentially connected to each other in series. The second pulse transformer includes a primary winding and a plurality of secondary windings, and the primary winding is electrically coupled to the driving primary circuit. One of the third pulse transformers includes a primary winding and a secondary winding, another one of the third pulse transformers comprises a primary winding and a plurality of secondary windings, and the primary windings are electrically coupled to the driving primary circuit, wherein the primary windings are sequentially connected to each other in series.

In addition, one of the fourth pulse transformers includes a primary winding and a secondary winding, and the primary windings are electrically coupled to the driving primary circuit, wherein the primary windings are sequentially connected to each other in series. The fifth pulse transformer includes a primary winding and a plurality of secondary windings, and the primary winding is electrically coupled to the driving primary circuit. One of the sixth pulse transformers includes a primary winding and a secondary winding, another one of the sixth pulse transformers comprises a primary winding and a plurality of secondary windings, and the primary windings are electrically coupled to the driving primary circuit, wherein the primary windings are sequentially connected to each other in series.

Another aspect of the present disclosure provides a power conversion device. The power conversion device includes a first power semiconductor switch unit and a driving device. The driving device includes a control circuit, a driving primary circuit, an isolating transforming circuit, and a plurality of driving secondary circuit. The driving primary circuit is coupled to the control circuit, and the isolating transforming circuit is coupled to the driving primary circuit. The driving device is configured to drive the first power semiconductor switch unit. The control circuit is configured to output a control signal. The driving primary circuit is configured to receive the control signal and a power signal. The driving primary circuit generates a driving pulse signal based on the control signal, and generates a power pulse signal based on the power signal. The isolating transforming circuit includes a first isolating transforming unit and a second isolating transforming unit. The first isolating transforming unit includes one of a plurality of first pulse transformers, a second pulse transformer, and a plurality of third pulse transformers. The second isolating transforming unit includes one of a plurality of fourth pulse transformers, a fifth pulse transformer, and a plurality of sixth pulse transformers. One of the first pulse transformers includes a primary winding and a secondary winding. The primary windings are electrically coupled to the driving primary circuit. The primary windings are sequentially connected to each other in series. The second pulse transformer includes a primary winding and a plurality of secondary windings. The primary winding is electrically coupled to the driving primary circuit. One of the third pulse transformers includes a primary winding and a secondary winding. Another one of the third pulse transformers includes a primary winding and a plurality of secondary windings. The primary windings are electrically coupled to the driving primary circuit. The primary windings are sequentially connected to each other in series.

In addition, one of the fourth pulse transformers includes a primary winding and a secondary winding. The primary windings are electrically coupled to the driving primary circuit. The primary windings are sequentially connected to each other in series. The fifth pulse transformer includes a primary winding and a plurality of secondary windings. The primary winding is electrically coupled to the driving primary circuit. One of the sixth pulse transformers includes a primary winding and a secondary winding. Another one of the sixth pulse transformers includes a primary winding and a plurality of secondary windings. The primary windings are electrically coupled to the driving primary circuit. The primary windings are sequentially connected to each other in series. The driving secondary circuits are all coupled to the secondary windings, and configured to receive the driving pulse signal and the power pulse signal through the isolating transforming circuit. The driving secondary circuits generate a driving signal based on the driving pulse signal so as to drive the first power semiconductor switch unit.

Still another aspect of the present disclosure provides a drive method. The driving method is applied in a driving device. The driving device includes a driving primary circuit, the above-mentioned isolating transforming circuit, and at least one driving secondary circuit. At least one driving secondary circuit is coupled to a plurality of secondary windings of the isolating transforming circuit. The drive method includes receiving a control signal and a power signal by the driving primary circuit; generating a driving pulse signal based on the control signal by the driving primary circuit, and generating a power pulse signal based on the power signal by the driving primary circuit; transmitting the driving pulse signal through the second isolating transforming unit and transmitting the power pulse signal through the first isolating transforming unit to the at least one driving secondary circuit; and receiving the driving pulse signal and generating a driving signal based on the driving pulse signal by the at least one driving secondary circuit so as to drive a power semiconductor switch unit.

In view of the foregoing, embodiments of the present disclosure provide a power conversion device, a driving device and a drive method so as to overcome problems associated with high manufacturing costs and low reliability caused by using optical isolation devices for transmitting driving signals.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows.

Figure 1:
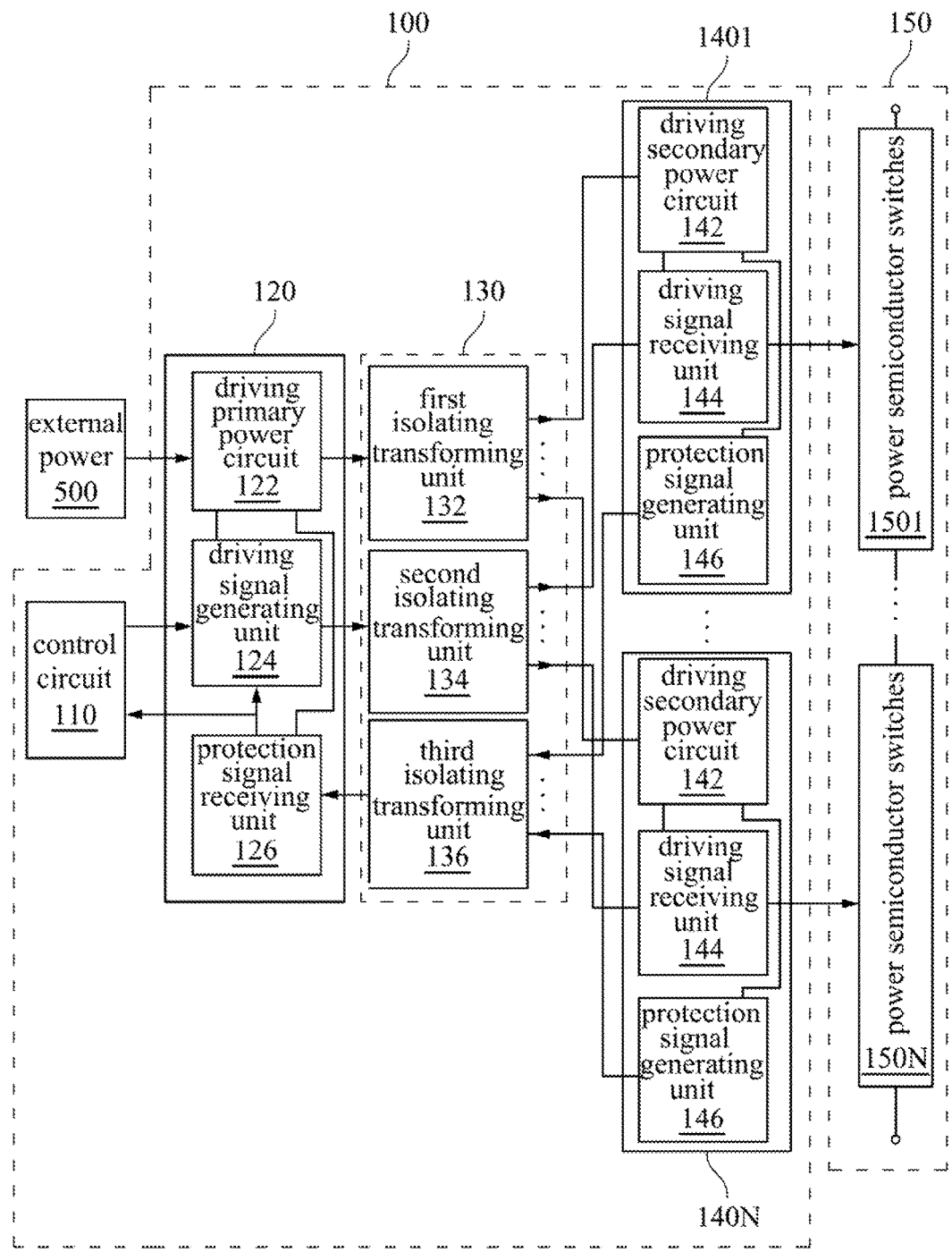
FIG. 1 is a schematic diagram of a power conversion device according to embodiments of the present disclosure.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular.

FIG. 1 is a schematic diagram of a power conversion device according to embodiments of the present disclosure. As shown in the figure, the power conversion device comprises a driving device 100 and a power semiconductor switch unit 150. Furthermore, the driving device 100 comprises a control circuit 110, a driving primary circuit 120, an isolating transforming circuit 130, and a driving secondary circuit (for example, a driving secondary circuit 1401).

With respect to a power signal transmitting path, the driving primary circuit 120 is electrically coupled to an external power 500, and the external power 500 provides a power signal to the driving primary circuit 120. The driving primary circuit 120 is electrically coupled to the driving secondary circuit 1401 through the isolating transforming circuit 130. Hence, the driving primary circuit 120 may provide the power signal to the driving secondary circuit 1401 through the isolating transforming circuit 130. Through such a configuration, the power signal provided by the external power 500 can be provided to the driving primary circuit 120 and the driving secondary circuit 1401 through the power signal transmitting path.

With respect to the driving signal transmitting path, the control circuit 110 is electrically coupled to the driving primary circuit 120, and the control circuit 110 provides a control signal to the driving primary circuit 120. The control signal can be a logic level a with high/low voltage level, for example, a pulse width modulation (PWM) signal, but the present disclosure is not limited in this regard. The driving primary circuit 120 is electrically coupled to the driving secondary circuit 1401 through the isolating transforming circuit 130. Hence, the driving primary circuit 120 may transmit the control signal to the driving secondary circuit 1401 through the isolating transforming circuit 130. Through such a configuration, the control signal provided by the control circuit 110 can be provided to the driving secondary circuit 1401 through the driving signal transmitting path, such that the driving secondary circuit 1401 generates the driving signal based on the control signal so as to drive the power semiconductor switch unit 150.

As can be seen from the above, the power conversion device of embodiments of the present disclosure transmits the control signal to the driving secondary circuit 1401 through the driving signal transmitting path so as to drive the power semiconductor switch unit 150. In addition, the power conversion device of embodiments of the present disclosure provides the power signal to the driving secondary circuit 1401 through the power signal transmitting path, such that the driving secondary circuit 1401 can work efficiently.

In one embodiment, the driving device 100 comprises a plurality of driving secondary circuits 1401~140N, and the driving secondary circuits 1401~140N are all electrically coupled to the isolating transforming circuit 130. Hence, the driving primary circuit 120 is electrically coupled to the driving secondary circuits 1401~140N through the isolating transforming circuit 130, and the driving primary circuit 120 transmits the control signal and the power signal to each of the driving secondary circuits 1401~140N through the isolating transforming circuit 130 at the same time.

In another embodiment, with reference to FIG. 1, the driving primary circuit 120 comprises a driving primary power circuit 122, a driving signal generating unit 124, and a protection signal receiving unit 126. Furthermore, the isolating transforming circuit 130 comprises a first isolating transforming unit 132, a second isolating transforming unit 134, and a third isolating transforming unit 136. Moreover, the driving secondary circuit 1401 comprises a driving secondary power circuit 142, a driving signal receiving unit 144, and a protection signal generating unit 146. Furthermore, the power semiconductor switch unit 150 comprises power semiconductor switches 1501~150N. In one embodiment, the power semiconductor switches 1501~150N can be connected to each other in series. In another embodiment, each of the power semiconductor switches 1501~150N comprises one or a plurality of power semiconductor switch elements not shown. When any one of the power semiconductor switches 1501~150N comprises a plurality of power semiconductor switch elements, the power semiconductor switch elements can be connected to in parallel. The power semiconductor switch elements can be insulated gate bipolar translators (IGBTs) or other fully-controlled power semiconductor elements.

In this embodiment, with respect to the power signal transmitting path, the driving primary power circuit 122 is electrically coupled to the external power 500, and the external power 500 provides the power signal to the driving primary power circuit 122. The driving primary power circuit 122 generates a driving primary power and a power pulse signal based on the power signal, and the driving primary power circuit 122 provides the driving primary power to the driving signal generating unit 124 and the protection signal receiving unit 126 of the driving primary circuit 120. The driving primary power circuit 122 generates a corresponding voltage based on the voltage demand of the driving signal generating unit 124 and the protection signal receiving unit 126. The driving primary power circuit 122 is electrically coupled to the driving secondary power circuit 142 of the driving secondary circuits 1401~140N through the first isolating transforming unit 132. Hence, the driving primary power circuit 122 transmits the power pulse signal to the driving secondary power circuit 142 through the first isolating transforming unit 132. The driving secondary power circuit 142 is configured to receive the power pulse signal and generate the driving secondary power based on power pulse signal so as to provide the driving secondary power to the driving signal receiving unit 144 and the protection signal generating unit 146. The driving secondary power circuit 142 generates a corresponding voltage based on the voltage demand of the driving signal receiving unit 144 and the protection signal generating unit 146. Hence, the power signal provided by the external power 500 can be provided to electrical elements in the driving primary circuit 120 and driving secondary circuits 1401~140N efficiently through the power signal transmitting network. In this embodiment, an isolating transformer unit is employed so as to isolate the power supply of the driving primary circuit and that of the driving secondary circuits efficiently. Meanwhile, the isolating transformer unit can isolate the power supplies among the driving secondary circuits efficiently.

In this embodiment, with respect to the driving signal transmitting path, the control circuit 110 is electrically coupled to the driving signal generating unit 124, and the control circuit 110 provides the control signal to the driving signal generating unit 124. The driving signal generating unit 124 receives the control signal, and generates a driving pulse signal based on the control signal. In this embodiment, the driving signal generating unit 124 performs a signal processing process with respect to the control signal (that is to say, a logic level signal with a high/low level) for generating a driving pulse signal. The driving pulse signal comprises a turn-on pulse signal and a turn-off pulse signal. It is noted that the pulse width of the turn-on pulse signal is less than the width of the high voltage level of the control signal. For example, the width of the turn-on pulse signal and the width of the turn-off pulse signal each may be 50 ns-10 us. If the driving signal generating unit 124 receives a rising edge of a logic level signal, the logic level signal is modulated to generate the turn-on pulse signal. If the driving signal generating unit 124 receives a falling edge of the logic level signal, the logic level signal is modulated to generate the turn-off pulse signal. The driving signal generating unit 124 is electrically coupled to the driving signal receiving unit 144 of the driving secondary circuits 1401~140N through the second isolating transforming unit 134. Hence, the driving signal generating unit 124 transmits the driving pulse signal to the driving signal receiving unit 144 through the second isolating transforming unit 134. The driving signal receiving unit 144 receives the driving pulse signal, and the driving signal receiving unit 144 generates the driving signal based on the driving pulse signal for driving the power semiconductor switches 1501~150N of the power semiconductor switch unit 150. In this embodiment, the driving signal receiving unit 144 receives the driving pulse signal transmitted from the second isolating transforming unit 134, and the driving signal receiving unit 144 latches and amplifies the driving pulse signal, such that the power semiconductor switch can be driven to work normally by the driving signal. For example, if the driving signal receiving unit receives the turn-on pulse signal, the turn-on pulse signal is latched with a high voltage level. If the driving signal receiving unit receives the turn-off pulse signal, the turn-off pulse is latched with a low voltage level. Specifically, the hold time which the driving signal receiving unit 144 generates a high voltage level extends from a time at which the turn-on pulse signal is received to a time at which the turn-off pulse signal is received. The hold time which the driving signal receiving unit 144 generates a low voltage level extends form a time at which the turn-off pulse signal is received to a time at which the turn-on pulse signal is received. Therefore, a driving signal with a high/low voltage level is generated, and the driving signal is amplified, such that the amplified driving signal is able to drive the power semiconductor switch. In one embodiment, the control signal provided by the control circuit 110 and the driving signal generated by the driving signal receiving unit 144 have corresponding features. For example, the waveforms of the control signal and the driving signal rise and fall together at some time points of a control timing, and other features of the waveforms of the control signal and the driving signal are similar. Through such operation, the control features of the control signal provided by the control circuit 110 can be efficiently provided to the driving signal receiving units 144 of the driving secondary circuits 1401~140N via the driving signal transmitting path, such that each of the driving signal receiving units 144 drives the power semiconductor switches 1501~150N of the power semiconductor switch unit 150 based on the control features of the control signal.

In this embodiment, with respect to the protection signal transmitting path, the protection signal generating unit 146 of each of the driving secondary circuits 1401~140N comprises a malfunction signal detection mechanism. Hence, the protection signal generating unit 146 is configured to perform detection with respect to the power semiconductor switches 1501~150N of the power semiconductor switch unit 150 for determining whether the power semiconductor switches 1501~150N of the power semiconductor switch unit 150 are malfunctioning, whether the driving secondary power circuit 142 is malfunctioning, or whether an assembly of the detect the power semiconductor switches 1501~150N of the power semiconductor switch unit 150 and the driving secondary power circuit 142 is malfunctioning. If any of the power semiconductor switches 1501~150N of the power semiconductor switch unit 150 is malfunctioning, or the driving secondary power circuit 142 is malfunctioning, or an assembly of any of the power semiconductor switches 1501~150N of the power semiconductor switch unit 150 and the driving secondary power circuit 142 is malfunctioning, the malfunction signal will be transmitted back through a protection signal transmitting path. Specifically, the protection signal generating unit 146 of the driving secondary circuits 1401~140N are all electrically coupled to the third isolating transforming unit 136, and the third isolating transforming unit 136 is electrically coupled to the protection signal receiving unit 126. Hence, each of the protection signal generating units 146 efficiently transmits the malfunction signal to the protection signal receiving unit 126 through the third isolating transforming unit 136.

In summary, the power conversion device of embodiments of the present disclosure provides the power signal to all protection signal generating units 146 through the power signal transmitting path, such that the protection signal generating unit 146 efficiently performs detection with respect to the power semiconductor switches 1501~150N of the power semiconductor switch unit 150 for determining whether the power semiconductor switches 1501~150N of the power semiconductor switch unit 150, the driving secondary power circuit 142, or an assembly of the power semiconductor switches 1501~150N of the power semiconductor switch unit 150 and the driving secondary power circuit 142 is malfunctioning. In addition, the power conversion device of embodiments of the present disclosure can transmit back the malfunction signal through a protection signal transmitting path if the power semiconductor switches 1501~150N of the power semiconductor switch unit 150, the driving secondary power circuit 142, or an assembly of the power semiconductor switches 1501~150N of the power semiconductor switch unit 150 and the driving secondary power circuit 142 is malfunctioning. Hence, compared with transmitting a malfunction signal through an optical isolation element, transmitting back a signal through the third isolating transforming unit 136 adopted by the present disclosure can effectively reduce manufacturing costs and enhance reliability.

In another embodiment, each of the protection signal generating units 146 of the driving secondary circuit 1401~140N is configured to receive a malfunction signal, and generate a malfunction pulse signal based on the malfunction signal. Each of the protection signal generating units 146 of the driving secondary circuit 1401~140N is configured to output a malfunction pulse signal, the third isolating transforming unit 136 is configured to receive the malfunction pulse signal and output a protection signal to the protection signal receiving unit 126. In this embodiment, the third isolating transforming unit 136 receives one or a plurality of malfunction pulse signals, and outputs the protection pulse signal. For example, if the third isolating transforming unit 136 receives malfunction pulse signals, the third isolating transforming unit 136 outputs a protection pulse signal. If the protection signal receiving unit 126 receives the protection pulse signal, the protection signal receiving unit 126 generates a protection signal based on the protection pulse signal. The protection signal receiving unit 126 transmits the protection signal to the driving signal generating unit 124. Subsequently, the driving signal generating unit 124 generates a driving terminal turn-off signal based on the protection signal, and transmits the turn-off signal to the power semiconductor switch unit 150 for turning off the power semiconductor switch unit 150.

In another embodiment, it is noted that the power semiconductor switch unit 150 as shown in FIG. 1 is merely one of the power semiconductor switch units in the power conversion device. In practice, the power conversion device comprises a plurality of power semiconductor switch units (not shown), and these power semiconductor switch units each has an independent driving device (not shown). If the protection signal receiving unit 126 generates a protection signal, the protection signal receiving unit 126 transmits the protection signal to the driving signal generating unit 124 and the control circuit 110 at the same time. Subsequently, the driving signal generating unit 124 generates a driving terminal turn-off signal based on the protection signal, and transmits the driving terminal turn-off signal to the power semiconductor switch unit 150 for turning off the power semiconductor switch unit 150. The control circuit 110 generates a control terminal turn-off signal based on the protection signal, and transmits the control terminal turn-off signal to the power conversion device, and to another power semiconductor switch unit (not shown) external to the power semiconductor switch unit 150, such that the purpose of turning off all power semiconductor switch units in the power conversion device can be achieved. In other embodiments, if the protection signal receiving unit 126 generates the protection signal, the protection signal receiving unit 126 only transmits the protection signal to the control circuit 110. The control circuit 110 then generates a control terminal turn-off signal based on the protection signal, and transmits the control terminal turn-off signal to the power conversion device, and to another power semiconductor switch unit (not shown) external to the power semiconductor switch unit 150, such that the purpose of turning off all power semiconductor switch units in the power conversion device can be achieved.

Figure 2:
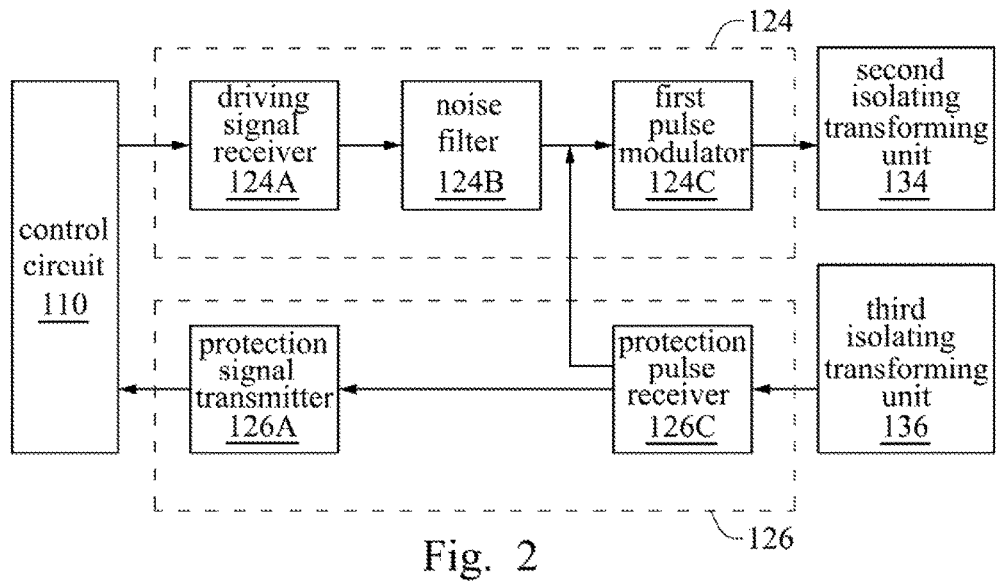
FIG. 2 is a schematic diagram of a portion of a power conversion device according to embodiments of the present disclosure.

FIG. 2 is a schematic diagram of a portion of a power conversion device according to embodiments of the present disclosure. As shown in the figure, the driving signal generating unit 124 comprises a driving signal receiver 124A, a noise filter 124B, and a first pulse modulator 124C. The driving signal receiver 124A is electrically coupled to the control circuit 110, the noise filter 124B is electrically coupled to driving signal receiver 124A, and the first pulse modulator 124C is electrically coupled to the noise filter 124B. The driving signal receiver 124A is configured to receive a control signal from the control circuit 110 the noise filter 124B is configured to receive and filter noise from the control signal, and the first pulse modulator 124C is configured to receive the control signal and generate a driving pulse signal based on the control signal by modulating the control signal, such that the driving pulse signal is suitable for transmission by the second isolating transforming unit 134. In one embodiment, the noise filter 124B can be a narrow pulse suppressor so that the noise filter 124B can suppress a narrow pulse of the control signal to prevent other circuits from being affected by such a narrow pulse.

The protection signal receiving unit 126 comprises a protection signal transmitter 126A and a protection pulse receiver 126C. The protection signal transmitter 126A is coupled to the protection pulse receiver 126C, and the protection pulse receiver 126C is coupled to the third isolating transforming unit 136 and the first pulse modulator 124C. The protection pulse receiver 126C is configured to receive the protection pulse signal from the third isolating transforming unit 136, and generates a protection signal based on the protection pulse signal. Subsequently, the protection pulse receiver 126C transmits the protection signal to the first pulse modulator 124C.

It is noted that the signal outputted from the first pulse modulator 124C is determined by the driving signal transmitted by the noise filter 124B and the protection signal transmitted by the protection pulse receiver 126C. If the first pulse modulator 124C does not receive the protection signal, the first pulse modulator 124C will modulate and generate a driving pulse signal based on the control signal and output the driving pulse signal. If the first pulse modulator 124C receives the protection signal transmitted from the protection pulse receiver 126C, the first pulse modulator 124C will output a driving terminal turn-off signal for turning off the power semiconductor switch unit (not shown). The first pulse modulator 124C does not output the driving pulse signal. In addition, the protection signal transmitter 126A is configured to receive the protection signal and transmit the protection signal to the control circuit 110.

Figure 3:
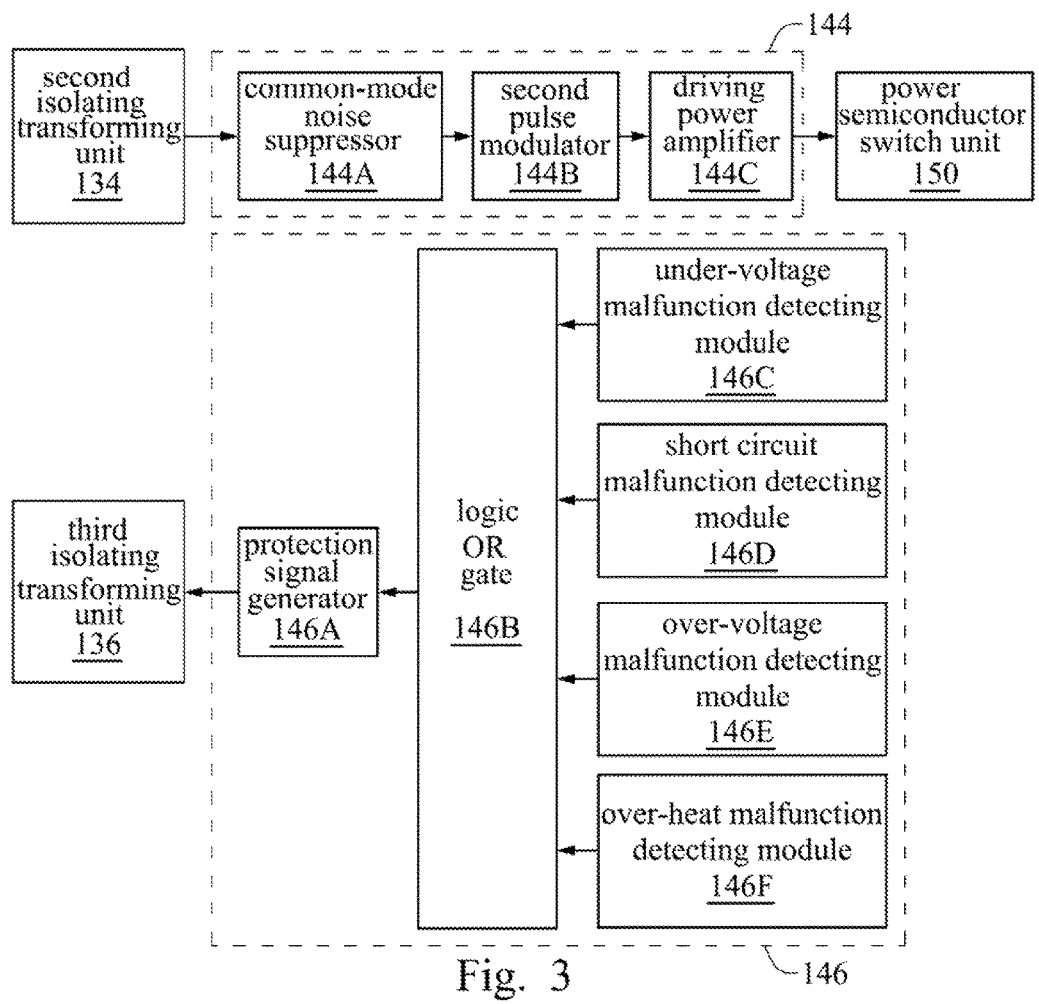
FIG. 3 is a schematic diagram of a portion of a power conversion device according to embodiments of the present disclosure.

FIG. 3 is a schematic diagram of a portion of a power conversion device according to embodiments of the present disclosure. As shown in the figure, the driving signal receiving unit 144 comprises a common-mode noise suppressor 144A, a second pulse modulator 144B, and a driving power amplifier 144C. The common-mode noise suppressor 144A is coupled to the second isolating transforming unit 134, the second pulse modulator 144B is coupled to the common-mode noise suppressor 144A, and the driving power amplifier 144C is coupled to the second pulse modulator 144B. The common-mode noise suppressor 144A receives the driving pulse signal from the first pulse modulator 124C (see FIG. 2) through the second isolating transforming unit 134, and the common-mode noise suppressor 144A can suppress a common-mode noise of the driving, pulse signal. The second pulse modulator 144B receives the driving pulse signal, and demodulates the driving pulse signal to generate a driving signal based on the driving pulse signal. That is to say, a turn-on and a turn-off pulse signal are demodulated to be logic level signals with high/low voltage levels. Since the driving signal does not have a driving capability, the driving power amplifier 144C amplifies the driving signal, so that the resulting amplified driving signal which has a driving capability can be used to drive the power semiconductor switch unit 150.

The protection signal generating unit 146 comprises a protection signal generator 146A, a logic OR gate 146B, an under-voltage malfunction detecting module 146C, a short circuit malfunction detecting module 146D, an over-voltage malfunction detecting module 146E, and an over-heat malfunction detecting module 146F. The output terminal of the logic OR gate 146B is coupled to the protection signal generator 146A. The under-voltage malfunction detecting module 146C is coupled to the first input terminal of the logic OR gate 146B. The short circuit malfunction detecting module 146D is coupled to the second input terminal of the logic OR gate 146B. The over-voltage malfunction detecting module 146E is coupled to the third input terminal of the logic OR gate 146B. The over-heat malfunction detecting module 146F is coupled to the fourth input terminal of the logic OR gate 146B. Due to the above-mentioned electrical connections, if any of the malfunction detecting modules detects a malfunction condition and therefore generates a malfunction signal, the protection signal generator 146A will receive the malfunction signal through the logic OR gate 146B, and generate a malfunction pulse signal based on the malfunction signal. Subsequently, the third isolating transforming, unit 136 receives the malfunction pulse signal and generates a protection pulse signal based on the malfunction pulse signal.

Figure 4:
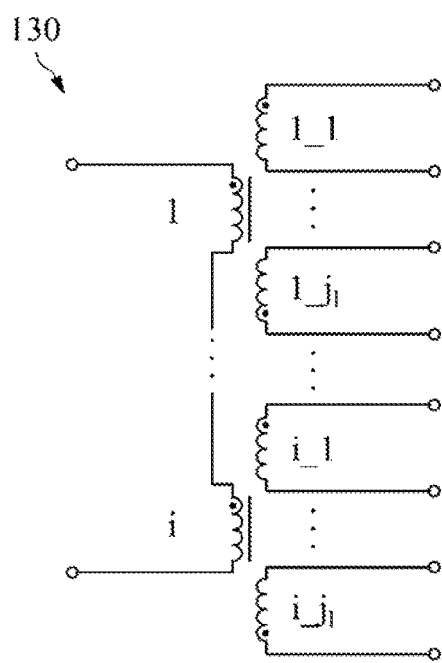
FIG. 4 is a schematic diagram of an isolating transforming circuit of a power conversion device according to embodiments of the present disclosure.

FIG. 4 is a schematic diagram of an isolating transforming circuit of a power conversion device according to embodiments of the present disclosure. It is noted that the first isolating transforming unit 132, the second isolating transforming unit 134, and the third isolating transforming unit 136 as shown in FIG. 1 can be implemented by structures as shown in FIG. 4. As shown in FIG. 4, the isolating transforming circuit comprises an i-number of transformers, and each of the transformers comprises a primary winding and at least one secondary winding. For example, the first transformer comprises a primary winding 1 and a secondary winding $1\_1 \sim 1\_j_1$, where $j_1$ is a positive integer whose volume is greater than one, and so on. The ith transformer comprises a primary winding 1 and a secondary winding $i\_1 \sim i\_j_i$, where $j_i$ is a positive integer whose volume is greater than one. In addition, the primary windings $1 \sim i$ of all the transformers are connected in series, and two terminals of the primary winding structure formed by series connections are electrically coupled to the driving primary circuit. On the other hand, the secondary winding of each of the transformers is electrically coupled to the driving secondary circuit.

Figure 5:
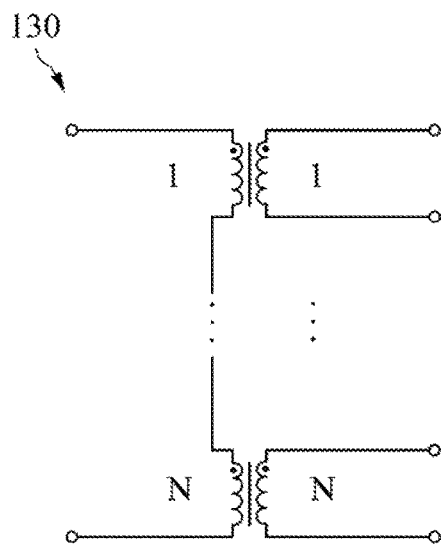
FIG. 5 is a schematic diagram of an isolating transforming circuit of a power conversion device according to embodiments of the present disclosure.

FIG. 5 is a schematic diagram of an isolating transforming circuit of a power conversion device according to embodiments of the present disclosure. It is noted that the first isolating transforming unit 132, the second isolating transforming unit 134, and the third isolating transforming unit 136 as shown in FIG. 1 can be implemented by structures as shown in FIG. 5. As shown in FIG. 5, the isolating transforming circuit comprises an N-number transformers, and each of the transformers comprises a primary winding and a secondary winding. In addition, the primary windings of all the transformers are connected in series, and two terminals of the primary winding structure formed by series connections are electrically coupled to the driving primary circuit. On the other hand, the secondary winding of each of the transformers is electrically coupled to the driving secondary circuit.

Embodiments for implementing the above-mentioned structures will be described below. In one embodiment, the first isolating transforming unit 132 comprises a plurality of pulse transformers, and one of the pulse transformers comprises a primary winding and a secondary winding. A plurality of primary windings are electrically coupled to the driving primary circuit 120, and the primary windings are sequentially connected to each other in series. Each of the secondary windings is electrically coupled to one of the driving secondary circuits 1401~140N correspondingly. In another embodiment, the first isolating transforming unit 132 comprises a pulse transformer, and the pulse transformer comprises a primary winding and a plurality of secondary windings. The primary winding is electrically coupled to the driving primary circuit 120. Each of the secondary windings is electrically coupled to one of the driving secondary circuits 1401-140N correspondingly. In still another embodiment, the first isolating transforming unit 132 comprises a plurality of pulse transformers. One of the transformers comprises a primary winding and a secondary winding, and another one of the pulse transformers comprises a primary winding and a plurality of secondary windings. The primary windings are electrically coupled to the driving primary circuit 120, and the primary windings are sequentially connected to each other in series. Each of the secondary windings is electrically coupled to one of the driving secondary circuits 1401-140N correspondingly.

In yet another embodiment, the second isolating transforming unit 134 comprises a plurality of pulse transformers, and one of the pulse transformers comprises a primary winding and a secondary winding. The primary winding is electrically coupled to the driving primary circuit 120, and the primary windings are sequentially connected to each other in series. Each of the secondary windings is electrically coupled to one of the driving secondary circuits 1401-140N correspondingly. In another embodiment, the second isolating transforming unit 134 comprise a pulse transformer, and the pulse transformer comprises a primary winding and a plurality of secondary windings. The primary winding is electrically coupled to the driving primary circuit 120. Each of the secondary windings is electrically coupled to one of the driving secondary circuits 1401-140N correspondingly. In still another embodiment, the second isolating transforming unit 134 comprises a plurality of pulse transformers. One of the pulse transformers comprises a primary winding and a secondary winding, and another one of the pulse transformers comprises a primary winding and a plurality of secondary windings. The primary winding is electrically coupled to driving primary circuit 120, and the primary windings are sequentially connected to each other in series. Each of the secondary windings is electrically coupled to one of the driving secondary circuits 1401-140N correspondingly.

In another embodiment, the third isolating transforming unit 136 comprises a plurality of pulse transformers. Each of the pulse transformers comprises an input winding, a magnetic core, and an output winding. The input winding of each of the pulse transformers is electrically coupled to one of the protection signal generating units 146 correspondingly. The output windings of the pulse transformers are sequentially connected to each other in series, and electrically coupled to the protection signal receiving unit 126. In one embodiment, the third isolating transforming unit 136 comprises a pulse transformer, and the pulse transformer comprises a plurality of input windings, a magnetic core, and an output winding. Each of the input winding is electrically coupled to one of the protection signal generating units 146 correspondingly, and the output winding is electrically coupled to the protection signal receiving unit 126. In another embodiment, the third isolating transforming unit 136 comprises a plurality of pulse transformers. One of the pulse transformers comprises an input winding, a magnetic core, and an output winding, and another one of the pulse transformers comprises a plurality of input windings, a magnetic core, and an output winding. Each of the input winding is electrically coupled to one of the protection signal generating units 146 correspondingly. The output windings are sequentially connected to each other in series, and electrically coupled to the protection signal receiving unit 126.

Figure 6:
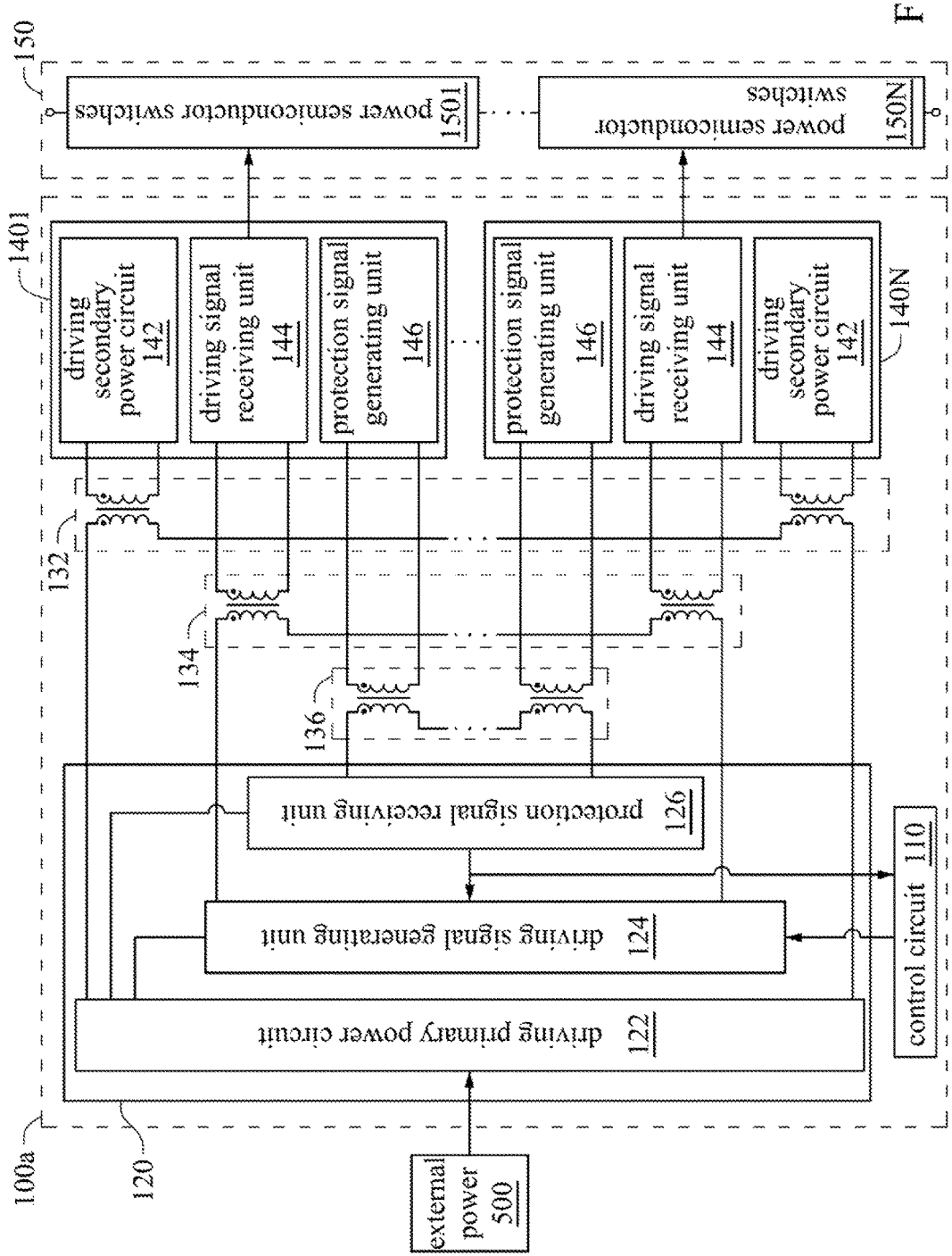
FIG. 6 is a schematic diagram of a power conversion device according to embodiments of the present disclosure.

FIG. 6 is a schematic diagram of a power conversion device according to embodiments of the present disclosure. It should be noted that, in the power conversion device of FIG. 6, the reference numbers of the electronic components that are similar to those used in the power conversion device illustrated in FIG. 1 have the same electric operation characteristics. For the sake of brevity, the electric components with similar reference numbers will not be discussed in detail hereinbelow, and rather, only the differences between the power conversion device of FIG. 6 and the power conversion device of FIG. 1 are discussed. Compared with the power conversion device as shown in FIG. 1, in the power conversion device shown in FIG. 6, the structures of a first isolating transforming unit 132, a second isolating transforming unit 134, and a third isolating transforming unit 136, as well as the connections among the first isolating transforming unit 132, the second isolating transforming unit 134, the third isolating transformer 136, and other electrical devices are illustrated in detail.

Specifically, the first isolating transforming unit 132 comprises N pulse transformers. N driving secondary power circuit units 142 of the driving secondary circuits 1401~140N are electrically coupled to the driving primary power circuit 122 through corresponding pulse transformers respectively. In addition, the second isolating transforming unit 134 comprises N pulse transformers. N driving signal receiving units 144 of the driving secondary circuits 1401~140N are electrically coupled to the driving signal generating unit 124 through corresponding pulse transformers respectively. Furthermore, the third isolating transformer 136 comprises N pulse transformers. N protection signal generating units 146 of the driving secondary circuits 1401~140N are electrically coupled to the protection signal receiving unit 126 through corresponding pulse transformers respectively.

Figure 7:
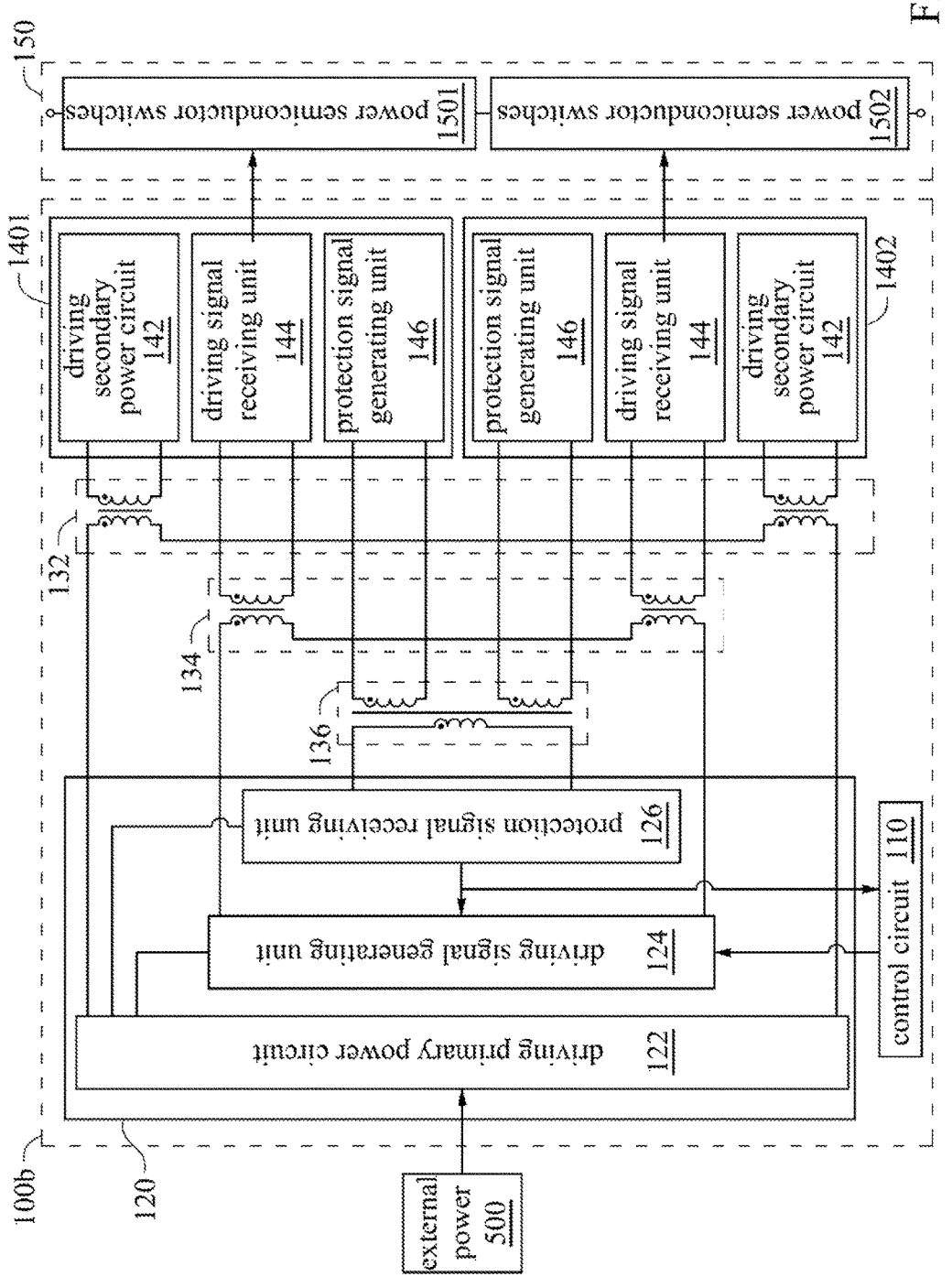
FIG. 7 is a schematic diagram of a power conversion device according to embodiments of the present disclosure.

FIG. 7 is a schematic diagram of a power conversion device according to embodiments of the present disclosure. It should be noted that, in the power conversion devices of FIG. 7, the reference numbers of the electronic components that are similar to those used in the power conversion device illustrated in FIG. 6 have the same electric operation characteristics. For the sake of brevity, the electric components with similar reference numbers will not be discussed in detail hereinbelow, and rather, only the differences between the power conversion device of FIG. 7 and the power conversion device of FIG. 6 are discussed.

Compared with the power conversion device as shown in FIG. 6, the third isolating transforming unit 136 of the power conversion device shown in FIG. 7 comprises a pulse transformer, and the pulse transformer comprises a primary winding and two secondary windings. These secondary windings are electrically coupled to the protection signal generating units 146 of the driving secondary circuits 1401~1402 respectively. In addition, compared with the power conversion device as shown in FIG. 6, the power conversion device shown in FIG. 7 comprises two driving secondary circuits 1401~1402. Hence, the first isolating transforming unit 132 correspondingly comprises two pulse transformers. The second isolating transforming unit 134 also correspondingly comprises two pulse transformers. Connections between these pulse transformers and other electrical devices are the same as connections as shown in FIG. 6, and therefore, a description regarding such connections as shown in FIG. 7 is omitted herein.

Figure 8:
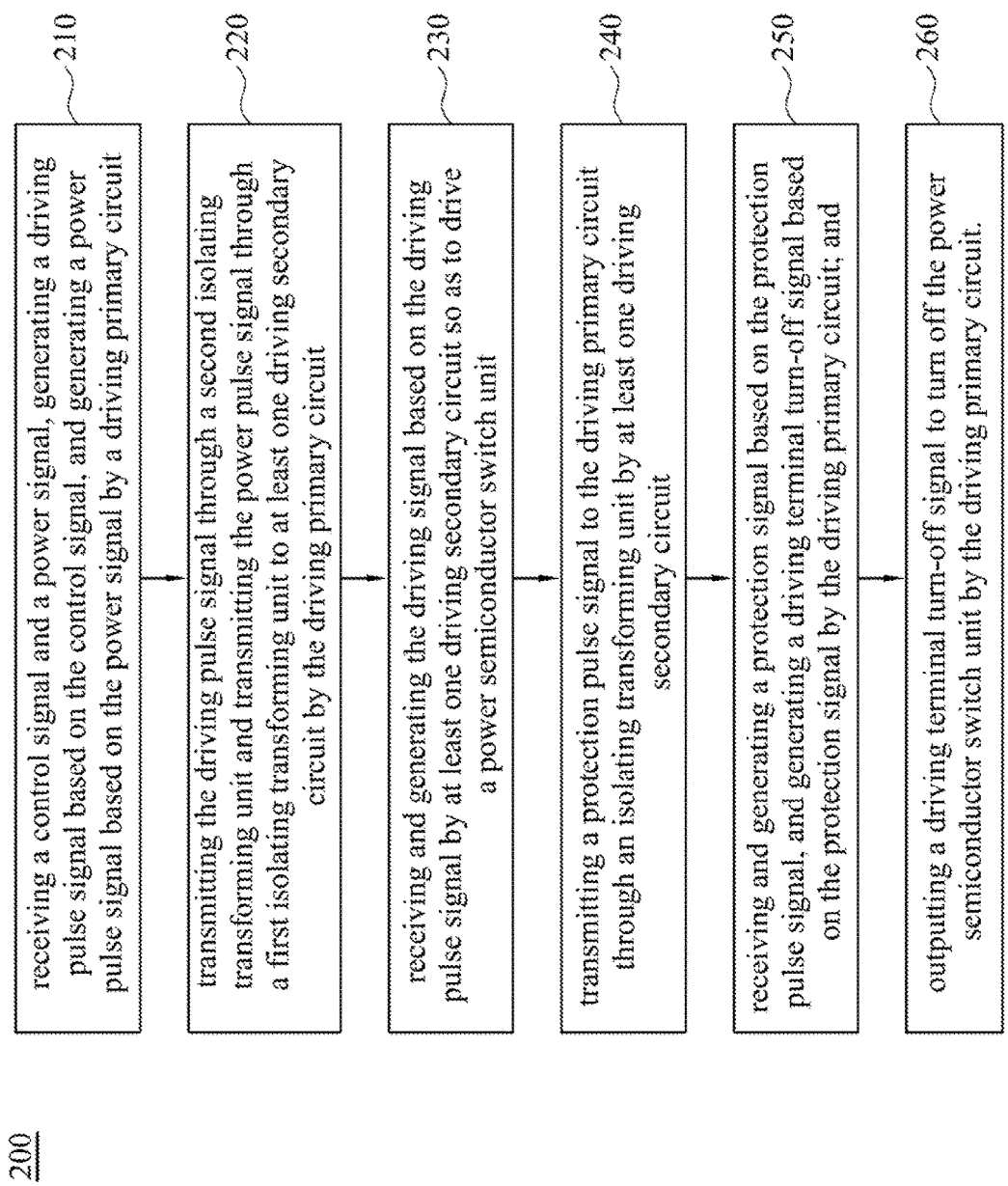
FIG. 8 is a flow diagram illustrating process steps of a driving method according to embodiments of the present disclosure.

FIG. 8 is a flow diagram illustrating process steps of a driving method 200 according to embodiments of the present disclosure. The drive method 200 can be implemented in the driving device 100 as shown in FIG. 1. The drive method 200 comprises the steps of:

step 210: receiving a control signal and a power signal, generating a driving pulse signal based on the control signal, and generating a power pulse signal based on the power signal by a driving primary circuit;

step 220: transmitting the driving pulse signal through a second isolating transforming unit and transmitting the power pulse signal through a first isolating transforming unit to at least one driving secondary circuit by the driving primary circuit;

step 230: receiving and generating the driving signal based on the driving pulse signal by at least one driving secondary circuit so as to drive a power semiconductor switch unit;

step 240: transmitting a protection pulse signal to the driving primary circuit through an isolating transforming circuit by at least one driving secondary circuit;

step 250: receiving and generating a protection signal based on the protection pulse signal, and generating a driving terminal turn-off signal based on the protection signal by the driving primary circuit; and step 260: outputting a driving terminal turn-off signal to turn off the power semiconductor switch unit by the driving primary circuit.

For facilitating the understanding of the above-mentioned drive method 200, reference is now made to both FIG. 1 and FIG. 8. In step 210, the driving primary circuit 120 is used to receive the control signal from the control circuit 110, and the driving primary circuit 120 is used to receive the power signal from the power 500. The driving primary circuit 120 is used to generate the driving pulse signal based on the control signal, and generate the power pulse signal based on the power signal. In step 220, the driving primary circuit 120 is used to transmit the driving pulse signal through the second isolating transforming unit 134 and transmit the power pulse, signal through the first isolating transforming unit 132 to at least one driving secondary circuit 1401. In step 230, at least one driving secondary circuit 1401 is used to generate the driving signal based on the driving pulse signal so as to drive the power semiconductor switch unit 150.

In step 240, at least one driving secondary circuit 1401 is used to transmit the protection pulse signal through the isolating transforming circuit 130 to the driving primary circuit 120. In step 250, the driving primary circuit 120 is used to receive and generate the protection signal based on the protection pulse signal, and generate a driving terminal turn-off signal based on the protection signal. In step 260, the driving primary circuit 120 is used to output the driving terminal turn-off signal for turning off the power semiconductor switch unit 150.

In another embodiment, the step of receiving the control signal and the power signal by the driving primary circuit in step 210 comprises receiving and filtering noise of the control signal, receiving the control signal, and modulating and generating the driving pulse signal based on the control signal. Referring to FIG. 2, the noise filter 124B is used to receive and filter noise of the control signal. Moreover, the first pulse modulator 124C is used to receive the control signal, and modulate and generate the driving pulse signal based on the control signal.

In still another embodiment, the step of receiving and generating the driving signal based on the driving pulse signal by at least one driving secondary circuit so as to drive a power semiconductor switch unit of step 230 comprises receiving and suppressing common-mode noise of the driving pulse signal; receiving the driving pulse signal, and demodulating and generating the driving signal based on the driving pulse signal; and amplifying the driving signal. Referring to FIG. 3, the common-mode noise suppressor 144A is used to receive and suppress common-mode noise of the driving pulse signal. In addition, the second pulse modulator 144B is used to receive the driving pulse signal, and demodulate and generate the driving signal based on the driving pulse signal. Furthermore, the driving power amplifier 144C is used to amplify the driving signal.

In yet another embodiment, the step of transmitting the protection pulse signal to the driving primary circuit through the isolating transforming circuit by at least one driving secondary circuit step of step 240 comprises detecting a power semiconductor switch unit, a driving secondary power circuit, or an assembly thereof, and generating a malfunction signal when one of the power semiconductor switch unit, the driving secondary power circuit, or the assembly thereof is malfunctioning and generating the malfunction pulse signal when receiving the malfunction signal. Referring to FIG. 3, any of the under-voltage malfunction detecting module 146C, the short circuit malfunction detecting module 146D, the over-voltage malfunction detecting module 146E, and the over-heat malfunction detecting module 146F is used to perform detection with respect to the power semiconductor switch unit, the driving secondary power circuit, or the assembly thereof, and generate the malfunction signal when one of the power semiconductor switch unit, the driving secondary power circuit, or the assembly thereof is malfunctioning. In addition, if the power semiconductor switch unit, the driving secondary power circuit, or the assembly thereof is malfunctioning, the protection signal generator 146A is used to receive the malfunction signal, and generate the malfunction pulse signal based on malfunction pulse signal for generating the protection pulse signal.

As may be appreciated by persons having ordinary skill in the art, the steps of the drive method 200 are named according to the function they perform, and such naming is provided to facilitate the understanding of the present disclosure but not to limit the steps. Combining the step into a single step or dividing any one of the steps into multiple steps, or switching any step so as to be a part of another step falls within the scope of the embodiments of the present disclosure.

In view of the above embodiments of the present disclosure. It is apparent that the application of the present disclosure has a number of advantages. Embodiments of the present disclosure provide a power conversion device, a driving device, and a drive method so as to overcome the problems of high manufacturing costs, low reliability, and low synchronicity caused by using optical isolation devices for transmitting driving signals.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A driving device, comprising:
 a driving primary circuit configured to receive a control signal and a power signal, wherein the driving primary circuit is configured to generate a driving pulse signal based on the control signal, and generate a power pulse signal based on the power signal;
 an isolating transforming circuit configured to be coupled to the driving primary circuit, wherein the isolating transforming circuit comprises a first isolating transforming unit and a second isolating transforming unit, wherein the first isolating transforming unit comprises a plurality of first pulse transformers, or a second pulse transformer, or a plurality of third pulse transformers, and the second isolating transforming unit comprises a plurality of fourth pulse transformers, or a fifth pulse transformer, or a plurality of sixth pulse transformers;
 wherein each one of the first pulse transformers comprises a primary winding and a secondary winding, and the primary windings of the first pulse transformers are electrically coupled to the driving primary circuit, wherein the primary windings of the first pulse transformers are sequentially connected to each other in series;
 wherein the second pulse transformer comprises a primary winding and a plurality of secondary windings, and the primary winding is electrically coupled to the driving primary circuit;
 wherein one of the third pulse transformers comprises a primary winding and a secondary winding, another one of the third pulse transformers comprises a primary winding and a plurality of secondary windings, and the primary windings of the third pulse transformers are electrically coupled to the driving primary circuit, wherein the primary windings of the third pulse transformers are sequentially connected to each other in series;
 wherein each one of the fourth pulse transformers comprises a primary winding and a secondary winding, and the primary windings of the fourth pulse transformers are electrically coupled to the driving primary circuit, wherein the primary windings of the fourth pulse transformers are sequentially connected to each other in series;

wherein the fifth pulse transformer comprises a primary winding and a plurality of secondary windings, and the primary winding is electrically coupled to the driving primary circuit;

wherein one of the sixth pulse transformers comprises a primary winding and a secondary winding, another one of the sixth pulse transformers comprises a primary winding and a plurality of secondary windings, and the primary windings of the sixth pulse transformers are electrically coupled to the driving primary circuit, wherein the primary windings of the sixth pulse transformers are sequentially connected to each other in series; and at least one driving secondary circuit configured to be coupled to the secondary windings, wherein the driving primary circuit transmits the driving pulse signal through the second isolating transforming unit and transmits the power pulse signal through the first isolating transforming unit to the at least one driving secondary circuit, wherein the at least one driving secondary circuit receives the driving pulse signal and generates a driving signal based on the driving pulse signal for driving a power semiconductor switch unit, wherein the driving primary circuit comprises:
a driving signal generating unit configured to receive the control signal, and generate the driving pulse signal based on the control signal; and
a driving primary power circuit configured to be coupled to the driving signal generating unit, wherein the driving primary power circuit receives the power signal and generates a driving primary power and the power pulse signal based on the power signal, wherein the driving primary power circuit is configured to provide the driving primary power for the driving signal generating unit;

wherein the at least one driving secondary circuit comprises:
a driving signal receiving unit configured to be coupled to the second isolating transforming unit, wherein the driving signal generating unit transmits the driving pulse signal to the driving signal receiving unit through the second isolating transforming unit, wherein the driving signal receiving unit is configured to receive the driving pulse signal and generate the driving signal based on the driving pulse signal so as to drive the power semiconductor switch unit; and
a driving secondary power circuit configured to be coupled to the first isolating transforming unit, wherein the driving primary power circuit transmits the power pulse signal to the driving secondary power circuit through the first isolating transforming unit, wherein the driving secondary power circuit is configured to receive the power pulse signal and generate a driving secondary power based on the power pulse signal so as to provide the driving secondary power for the driving signal receiving unit, wherein the driving signal generating unit comprises:
a driving signal receiver configured to receive the control signal;
a noise filter configured to be coupled to the driving signal receiver, and configured to receive and filter the noise of the control signal; and
a first pulse modulator configured to be coupled to the noise filter, wherein the first pulse modulator is configured to receive the control signal, and the first pulse modulator is configured to modulate and generate the driving pulse signal based on the control signal.

2. The driving device of claim 1, wherein the driving signal receiving unit comprises:
a common-mode noise suppressor configured to be coupled to the second isolating transforming unit, and configured to receive and suppress the common-mode noise of the driving pulse signal;
a second pulse modulator configured to be coupled to the common-mode noise suppressor, wherein the second pulse modulator is configured to receive the driving pulse signal, and the second pulse modulator is configured to demodulate and generate the driving signal based on the driving pulse signal; and
a driving power amplifier configured to be coupled to the second pulse modulator, and configured to amplify the driving signal.

3. The driving device of claim 1, wherein the driving primary circuit further comprises:
a protection signal receiving unit configured to be coupled to the driving primary power circuit, wherein the protection signal receiving unit is configured to receive a protection pulse signal and generate a protection signal based on the protection pulse signal, wherein the driving primary power circuit is configured to provide the driving primary power for the protection signal receiving unit;

wherein the isolating transforming circuit further comprises:
a third isolating transforming unit configured to be coupled to the protection signal receiving unit;
wherein the number of the at least one driving secondary circuit is plural, and each of the driving secondary circuits further comprises:
a protection signal generating unit configured to be coupled to the third isolating transforming unit and the driving secondary power circuit, wherein each of the protection signal generating units of the driving secondary circuits is configured to receive a malfunction signal, and generate a malfunction pulse signal based on the malfunction signal, wherein the third isolating transforming unit is configured to receive the malfunction pulse signals and output the protection pulse signal to the protection signal receiving unit.

4. The driving device of claim 3, wherein the protection signal receiving unit comprises:
a protection pulse receiver configured to be coupled to the third isolating transforming unit and the first pulse modulator, wherein the protection pulse receiver is configured to receive the protection pulse signal, and generate the protection signal based on the protection pulse signal, wherein the protection pulse receiver is configured to transmit the protection signal to the first pulse modulator, and if the first pulse modulator receives the protection signal, the first pulse modulator outputs a driving terminal turn-off signal so as to turn off the power semiconductor switch unit; and
a protection signal transmitter configured to be coupled to the protection pulse receiver, and configured to receive and transmit the protection signal.

5. The driving device of claim 3, further comprising:
a control circuit configured to be coupled to the driving signal receiver and the protection signal receiving unit, and configured to provide the control signal, wherein the control circuit is configured to receive the protection signal, and output a control terminal turn-off signal based on the protection signal so as to turn off the power semiconductor switch unit.

6. The driving device of claim 5, wherein the number of the power semiconductor switch unit is plural, wherein the control circuit turns off the power semiconductor switch units based on the protection signal.

7. The driving device of claim 3, wherein the protection signal generating unit comprises:
a malfunction detector configured to perform detection with respect to the power semiconductor switch unit, the driving secondary power circuit, or an assembly thereof, wherein the malfunction detector generates the malfunction signal if the power semiconductor switch unit, the driving secondary power circuit, or the assembly thereof is malfunctioning; and
a protection signal generator configured to be coupled to the malfunction detector, wherein the protection signal generator is configured to generate the malfunction pulse signal if the protection signal generator receives the malfunction signal.

8. The driving device of claim 7, wherein the protection signal generating unit further comprises:
a logic OR gate, wherein an output terminal of the logic OR gate is configured to be coupled to the protection signal generator;
wherein the malfunction detector comprises:
an under-voltage malfunction detecting module configured to be coupled to a first input terminal of the logic OR gate;
a short circuit malfunction detecting module configured to be coupled to a second input terminal of the logic OR gate;
an over-voltage malfunction detecting module configured to be coupled to a third input terminal of the logic OR gate; and
an over-heat malfunction detecting module configured to be coupled to a fourth input terminal of the logic OR gate.

9. The driving device of claim 3, wherein the third isolating transforming unit comprises a plurality of pulse transformers, and each of the pulse transformers comprises an input winding, a magnetic core, and an output winding, wherein the input winding of each of the pulse transformers is electrically coupled to one of the protection signal generating units correspondingly, wherein the output windings of the pulse transformers are sequentially connected to each other in series, and electrically coupled to the protection signal receiving unit.

10. The driving device of claim 3, wherein the third isolating transforming unit comprises a pulse transformer, and the pulse transformer comprises a plurality of input windings, a magnetic core, and an output winding, wherein each of the input windings is electrically coupled to one of the protection signal generating units correspondingly, and the output winding is electrically coupled to the protection signal receiving unit.

11. The driving device of claim 3, wherein the third isolating transforming unit comprises a plurality of pulse transformers, wherein one of the pulse transformers comprises an input winding, a magnetic core, and an output winding, and another one of the pulse transformers comprises a plurality of input windings, a magnetic core, and an output winding, wherein each of the input windings is electrically coupled to one of the protection signal generating units correspondingly, wherein the output windings are sequentially connected to each other in series, and electrically coupled to the protection signal receiving unit.

12. A power conversion device, comprising:
a first power semiconductor switch unit;
a driving device configured to drive the first power semiconductor switch unit, wherein the driving device comprises:
a control circuit configured to output a control signal;
a driving primary circuit configured to be coupled to the control circuit, and configured to receive the control signal and a power signal, wherein the driving primary circuit generates a driving pulse signal based on the control signal, and generates a power pulse signal based on the power signal;
an isolating transforming circuit configured to be coupled to the driving primary circuit, wherein the isolating transforming circuit comprises a first isolating transforming unit and a second isolating transforming unit, wherein the first isolating transforming unit comprises a plurality of first pulse transformers, or a second pulse transformer, or a plurality of third pulse transformers, and the second isolating transforming unit comprises a plurality of fourth pulse transformers, or a fifth pulse transformer, or a plurality of sixth pulse transformers;
wherein each one of the first pulse transformers comprises a primary winding and a secondary winding, and the primary windings of the first pulse transformers are electrically coupled to the driving primary circuit, wherein the primary windings of the first pulse transformers are sequentially connected to each other in series;
wherein the second pulse transformer comprises a primary winding and a plurality of secondary windings, and the primary winding is electrically coupled to the driving primary circuit;
wherein one of the third pulse transformers comprises a primary winding and a secondary winding, and another one of the third pulse transformers comprises a primary winding and a plurality of secondary windings, wherein the primary windings of the third pulse transformers are electrically coupled to the driving primary circuit, and the primary windings of the third pulse transformers are sequentially connected to each other in series;
wherein one of the fourth pulse transformers comprises a primary winding and a secondary winding, and the primary windings of the fourth pulse transformers are electrically coupled to the driving primary circuit, wherein the primary windings of the fourth pulse transformers are sequentially connected to each other in series;
wherein the fifth pulse transformer comprises a primary winding and a plurality of secondary windings, and the primary winding is electrically coupled to the driving primary circuit;
wherein one of the sixth pulse transformers comprises a primary winding and a secondary winding, and another one of the sixth pulse transformers comprises a primary winding and a plurality of secondary windings, wherein the primary windings of the sixth pulse transformers are electrically coupled to the driving primary circuit, and the primary windings of the sixth pulse transformers are sequentially connected to each other in series; and
a plurality of driving secondary circuits configured to be coupled to the secondary windings, and configured to receive the driving pulse signal and the power pulse signal through the isolating transforming circuit, wherein the driving secondary circuits generate a driving signal based on the driving pulse signal so as to drive the first power semiconductor switch unit, wherein the driving primary circuit comprises:

a driving signal generating unit configured to be coupled to the control circuit, wherein the driving signal generating unit is configured to receive the control signal, and generate the driving pulse signal based on the control signal; and a driving primary power circuit configured to be coupled to the driving signal generating unit, wherein the driving primary power circuit receives the power signal and generates a driving primary power and the power pulse signal based on the power signal, wherein the driving primary power circuit is configured to provide the driving primary power for the driving signal generating unit;

wherein the driving signal generating unit comprises:

a driving signal receiver configured to receive the control signal;

a noise filter configured to be coupled to the driving signal receiver, and configured to receive and filter noise of the control signal; and a first pulse modulator configured to be coupled to the noise filter, wherein the first pulse modulator is configured to receive the control signal, and the first pulse modulator is configured to modulate and generate the driving pulse signal based on the control signal, wherein each of the driving secondary circuits comprises a driving signal receiving unit and a driving secondary power circuit, wherein the driving signal receiving units are all coupled to the second isolating transforming unit, and configured to receive the driving pulse signal through the second isolating transforming unit, wherein the driving signal receiving units generate the driving signal based on the driving pulse signal, and are configured to drive the first power semiconductor switch unit, wherein the driving secondary power circuits are all coupled to the first isolating transforming unit, wherein the driving secondary power circuits are configured to receive the power pulse signal through the first isolating transforming unit, and generate a plurality of driving secondary power based on the power pulse signal, wherein the driving secondary power circuits provide the driving secondary power for the driving signal receiving units.

13. The power conversion device of claim 12, wherein each of the driving signal receiving units comprises:

a common-mode noise suppressor configured to be coupled to the second isolating transforming unit, and configured to receive and suppress common-mode noise of the driving pulse signal;

a second pulse modulator configured to be coupled to the common-mode noise suppressor, wherein the second pulse modulator is configured to receive the driving pulse signal, and the second pulse modulator is configured to demodulate and generate the driving signal based on the driving pulse signal; and a driving power amplifier configured to be coupled to the second pulse modulator, and configured to amplify the driving signal.

14. The power conversion device of claim 12, wherein the driving primary circuit further comprises:

a protection signal receiving unit configured to be coupled to the driving primary power circuit, wherein the protection signal receiving unit is configured to receive a protection pulse signal, and generate a protection signal based on the protection pulse signal, wherein the driving primary power circuit is configured to provide the driving primary power for the protection signal receiving unit;

wherein the isolating transforming circuit further comprises:

a third isolating transforming unit configured to be coupled to the protection signal receiving unit;

wherein each of the driving secondary circuits further comprises a protection signal generating unit, wherein the protection signal generating units are all coupled to the third isolating transforming unit and the driving secondary power circuit, wherein each of the protection signal generating units of the driving secondary circuits is configured to receive a malfunction signal, and generate a malfunction pulse signal based on the malfunction signal, wherein the third isolating transforming unit is configured to receive the malfunction pulse signals and output the protection pulse signal to the protection signal receiving unit.

15. The power conversion device of claim 14, wherein the protection signal receiving unit comprises:

a protection pulse receiver configured to be coupled to the third isolating transforming unit and the first pulse modulator, wherein the protection pulse receiver is configured to receive the protection pulse signal, and generate the protection signal based on the protection pulse signal, wherein the protection pulse receiver is configured to transmit the protection signal to the first pulse modulator, and if the first pulse modulator receives the protection signal, the first pulse modulator outputs a driving terminal turn-off signal so as to turn off the power semiconductor switch unit; and a protection signal transmitter configured to be coupled to the protection pulse receiver and the control circuit, and configured to receive and transmit the protection signal to the control circuit.

16. The power conversion device of claim 15, further comprising:

a second power semiconductor switch unit, wherein the control circuit turns off the second power semiconductor switch unit based on the protection signal.

17. The power conversion device of claim 14, wherein each of the protection signal generating units comprises:

a malfunction detector configured to perform detection with respect to the first power semiconductor switch unit, the driving secondary power circuit, or an assembly thereof, wherein the malfunction detector generates the malfunction signal if the first power semiconductor switch unit, the driving secondary power circuit, or the assembly thereof is malfunctioning; and a protection signal generator configured to be coupled to the malfunction detector, wherein the protection signal generator is configured to generate the malfunction pulse signal if the protection signal generator receives the malfunction signal.

18. The power conversion device of claim 17, wherein the protection signal generating unit further comprises:

a logic OR gate, wherein an output terminal of the logic OR gate is configured to be coupled to the protection signal generator;

wherein the malfunction detector comprises:

an under-voltage malfunction detecting module configured to be coupled to a first input terminal of the logic OR gate;

a short circuit malfunction detecting module configured to be coupled to a second input terminal of the logic OR gate;
an over-voltage malfunction detecting module configured to be coupled to a third input terminal of the logic OR gate; and
an over-heat malfunction detecting module configured to be coupled to a fourth input terminal of the logic OR gate.

19. The power conversion device of claim 14, wherein the third isolating transforming unit comprises a plurality of pulse transformers, and each of the pulse transformers comprises an input winding, a magnetic core, and an output winding, wherein the input winding of each of the pulse transformers is electrically coupled to one of the protection signal generating units correspondingly, wherein the output windings of the pulse transformers are sequentially connected to each other in series, and electrically coupled to the protection signal receiving unit.

20. The power conversion device of claim 14, wherein the third isolating transforming unit comprises a pulse transformer, and the pulse transformer comprises a plurality of input windings, a magnetic core, and an output winding, wherein each of the input windings is electrically coupled to one of the protection signal generating units correspondingly, and the output winding is electrically coupled to the protection signal receiving unit.

21. The power conversion device of claim 14, wherein the third isolating transforming unit comprises a plurality of pulse transformers, wherein one of the pulse transformers comprises an input winding, a magnetic core, and an output winding, and another one of the pulse transformers comprises a plurality of input windings, a magnetic core, and an output winding, wherein each of the input windings is electrically coupled to one of the protection signal generating units correspondingly, wherein the output windings are sequentially connected to each other in series, and electrically coupled to the protection signal receiving unit.

22. A driving method applied in a driving device, wherein the driving device comprises a driving primary circuit, the isolating transforming circuit of claim 1, and at least one driving secondary circuit, wherein the at least one driving secondary circuit is coupled to a plurality of secondary windings of the isolating transforming circuit, wherein the driving method comprises:
receiving a control signal and a power signal by the driving primary circuit;
generating a driving pulse signal based on the control signal by the driving primary circuit, and generating a power pulse signal based on the power signal by the driving primary circuit;
transmitting the driving pulse signal through the second isolating transforming unit and transmitting the power pulse signal through the first isolating transforming unit to the at least one driving secondary circuit; and
receiving the driving pulse signal and generating a driving signal based on the driving pulse signal by the at least one driving secondary circuit so as to drive a power semiconductor switch unit, wherein the step of receiving the control signal and the power signal by the driving primary circuit comprises:
receiving and filtering noise of the control signal; and
receiving the control signal, and modulating and generating the driving pulse signal based on the control signal.

23. The driving method of claim 22, wherein the step of receiving the driving pulse signal and generating the driving signal based on the driving pulse signal by the at least one driving secondary circuit so as to drive the power semiconductor switch unit comprises:
receiving and suppressing common-mode noise of the driving pulse signal;
receiving the driving pulse signal, and demodulating and generating the driving signal based on the driving pulse signal; and
amplifying the driving signal.

24. The driving method of claim 22, further comprising:
transmitting a protection pulse signal to the driving primary circuit through the isolating transforming circuit by the at least one driving secondary circuit; and
receiving the protection pulse signal and generating a protection signal based on the protection pulse signal by the driving primary circuit, and generating a driving terminal turn-off signal based on the protection signal by the driving primary circuit; and
outputting the driving terminal turn-off signal so as to turn off the power semiconductor switch unit by the driving primary circuit.

25. The driving method of claim 24, wherein the step of transmitting the protection pulse signal to the driving primary circuit through the isolating transforming circuit by the at least one driving secondary circuit comprises:
detecting the power semiconductor switch unit, the driving secondary circuit, or an assembly thereof, and generating a malfunction signal if the power semiconductor switch unit, the driving secondary circuit, or the assembly thereof is malfunctioning;
generating the malfunction pulse signal if the malfunction signal is received; and
generating the protection pulse signal based on the malfunction pulse signal.

* * * * *